United States Patent
Beckmann et al.

(10) Patent No.: US 6,841,942 B2
(45) Date of Patent: Jan. 11, 2005

(54) PLASMA SOURCE WITH RELIABLE IGNITION

(75) Inventors: Rudolf Beckmann, Hammersbach (DE); Markus Fuhr, Eppstein (DE); Walter Zultzke, Maintal (DE); Werner Weinrich, Langenselbold (DE)

(73) Assignee: Leybold Optics GmbH, Alzenau (DE)

( * ) Notice: Subject to any disclaimer, the term of this patent is extended or adjusted under 35 U.S.C. 154(b) by 0 days.

(21) Appl. No.: 10/663,434

(22) Filed: Sep. 16, 2003

(65) Prior Publication Data

US 2004/0084422 A1 May 6, 2004

(30) Foreign Application Priority Data

Sep. 18, 2002 (DE) .......................................... 102 43 406

(51) Int. Cl.[7] .................................................. H01J 7/24
(52) U.S. Cl. ............................. 315/111.51; 156/345.34
(58) Field of Search ......................... 315/111.21, 111.41, 315/111.51, 111.81, 111.91; 156/345.33, 345.34; 118/723 R

(56) References Cited

U.S. PATENT DOCUMENTS

| | | | |
|---|---|---|---|
| 4,358,686 A | 11/1982 | Kinoshita | ................. 250/492.2 |
| 4,970,435 A * | 11/1990 | Tanaka et al. | ........... 315/111.21 |
| 4,987,346 A | 1/1991 | Katzschner et al. | ..... 315/111.41 |
| 5,311,103 A * | 5/1994 | Asmussen et al. | ....... 315/111.81 |
| 6,060,836 A * | 5/2000 | Maeno et al. | ............ 315/111.21 |
| 6,261,406 B1 * | 7/2001 | Jurgensen et al. | ........ 156/345.3 |
| 6,453,842 B1 * | 9/2002 | Hanawa et al. | ............ 118/723 I |
| 6,551,446 B1 * | 4/2003 | Hanawa et al. | ......... 156/345.48 |
| 6,755,150 B2 * | 6/2004 | Lai et al. | ................... 118/723 I |
| 2002/0047536 A1 | 4/2002 | Ogawa et al. | ........... 315/111.21 |

FOREIGN PATENT DOCUMENTS

| | | |
|---|---|---|
| DE | 100 08 485 A1 | 9/2001 |
| JP | 61 124029 A | 6/1986 |
| RU | 2030015 | 2/1995 |
| RU | 1745080 | 3/1995 |
| SU | 1402185 | 4/1995 |
| WO | WO-01/63981 A1 | 8/2001 |

* cited by examiner

*Primary Examiner*—Thuy Vinh Tran
(74) *Attorney, Agent, or Firm*—Fulbright & Jaworski L.L.P.

(57) ABSTRACT

The invention relates to a plasma source whose plasma is ignited by an electric voltage. To be able to carry out the ignition at relatively low voltages, a plate (5) provided with holes (13, 14) is provided beneath a plasma volume (17), which is disposed above a wall (21) of a plasma chamber (3). Through this plate (5) an ignition volume (16) is formed beneath the plasma volume (17) with a higher pressure than in the plasma volume (17), in which the plasma ignites first. The ignition is subsequently propagated through the holes of the plate (5) into the plasma volume (17).

27 Claims, 1 Drawing Sheet

PLASMA SOURCE WITH RELIABLE IGNITION

FIELD OF THE INVENTION

The invention relates to a plasma source having a chamber, a plate at a spacing from a wall of the chamber in which plasma is generated, with this plate comprising throughbores, through which gas can flow into a plasma volume, whereby this plate forms with the wall of the chamber a closed volume and a gas inlet.

A plasma, in general, is comprised of a mixture of three components: free electrons, positive ions and neutral atoms or molecules. The plasma state is the natural state of any matter heated to very high temperatures.

To coat substrates with specific materials or to etch or clean substrates, plasmas are utilized from which, as a rule, the positive ions are accelerated by means of electric and/or magnetic fields out of a plasma onto the substrate.

For the generation of plasmas serve plasma sources or reactors. These plasma sources have in common that out of their originally electrically neutral gas or gas mixture a plasma is developed with the above listed three components.

A particle source is already known with which positive, negative and neutral particles can be generated and be transferred onto a substrate (DE 38 03 355 A1). This known particle source comprises a container in which is disposed a gas or a gas mixture to be ionized. Into this container radiates an electromagnetic wave, which is preferably a microwave. A toroidal magnetic field projects simultaneously into the container, which is generated with the aid of permanent magnets or electromagnets. Through the simultaneous action of the microwaves and of the magnetic field onto the electrons a so-called electron-cyclotron resonance is produced, which causes an intensive ionization. By means of a special control grid configuration, it is possible to draw positive, negative or neutral particles out of the container.

A high-frequency plasma source is furthermore known, which comprises a carrier element, on which a magnetic field coil configuration, a gas distribution system and a unit for the extraction of a plasma beam are disposed (WO 01/63981). Between an excitation electrode located in the plasma volume and a high-frequency generator of 13.56 MHz, located outside of the plasma volume, a matching circuit is provided, which is disposed in the plasma volume. The gas supply in the direction toward the carrier electrode takes place via a plate, which comprises gas conduction channels and is located at a spacing from two vacuum flow leadthroughs.

Of disadvantage in this plasma source is that it ignites only with a pressure pulse, i.e. to ignite the source, the pressure in the plasma volume of p=0.02 Pa must be raised to p>1 Pa. For this reason a very long time is required in order to return again to the original process pressure of 0.02 Pa. It is known that the ignition voltage at a gas gap depends on the product of gas pressure p and electrode spacing d (so-called Paschen curve, cf. Rutscher/Deutsch, Plasmatechnik, Grundlagen und Anwendung, 1984, p. 52-53). At low pressures, for example p<2 Pa, and typical electrode spacings, for example d<100 cm, an ignition voltage of more than 10 kV is necessary to ignite a plasma. In contrast for example to a fluorescent tube, which operates at higher pressures, the use of a high voltage for the plasma ignition is practically not possible, or at least highly elaborate, due to the extremely high ignition voltage. If, however, the pressure of the plasma is increased, ignition can readily take place at low ignition voltages. This applies if operation takes place on the left side of the Paschen curve, i.e. at pressures p<1 Pa. At pressures higher than approximately 0.05 Pa, the free path length of the ions is shorter than approximately 1 cm. Therewith the ions collide frequently with gas molecules and, on the way to the substrate to be treated, lose so much energy that the desired effect fails to appear, i.e. there are virtually no incoming ions.

An ion source is also known which comprises an auxiliary recess, with the pressure in the auxiliary recess being twice as high as the pressure in a hollow cathode (SU Patent 1 402 185). However, this auxiliary recess does not serve for ignition. The same also applies to other known ion sources (RU 1 745 080, RU 2 030 015).

The ignition of a plasma can also be facilitated through the use of a so-called ignition aid. As ignition aids serve, for example, hot cathodes, radioactive substances or classic spark plugs. These ignition aids, however, are highly maintenance- and/or cost-intensive. The voltage of the power supply alone can be viewed as low-maintenance and cost-effective ignition means.

However, it is also known an ignition aid in the form of a sub-discharge chamber having a higher pressure than the main-discharge chamber (JP 61 124029 A). Hereby the plasma of the sub-discharge chamber arrives inhomogeneously at the main-discharge chamber.

Further, a plasma producing device is known comprising a gas dispersion volume from which the gas enters into the plasma volume via an orifice plate (U.S. Ser. No. 2002/0047536 A1). Hereby the plasma dispersion volume is formed by the orifice plate and a wall of the plasma volume, whereby the orifice plate and the wall are electrically connected.

OBJECTS AND SUMMARY OF THE INVENTION

The invention addresses the problem of providing a plasma source in which a reliable ignition is attained without significant pressure increase in the plasma volume and in which the ignition takes place uniformly over the whole plasma volume.

This problem is solved according to the plasma source according to the present invention.

Consequently, the invention relates to a plasma source, whose plasma is ignited by means of an electric voltage. To be able to carry out the ignition at relatively low voltages, a plate provided with boreholes is provided beneath a plasma volume, which is located above a wall of a plasma chamber. Through this plate beneath the plasma volume an ignition volume is formed, with a higher pressure than in the plasma volume, in which the plasma by means of a provided voltage ignites first. The ignition subsequently propagates through the boreholes of the plate into the plasma volume.

The advantage attained with the invention comprises in particular that even without a pressure increase or at only minimal pressure increase in the plasma volume, the plasma can be ignited by merely applying the high-frequency voltage. In addition, the tendency to arcing is considerably reduced.

An embodiment example of the invention is depicted in the drawing and will be described in further detail.

DETAILED DESCRIPTION

Figure 1:
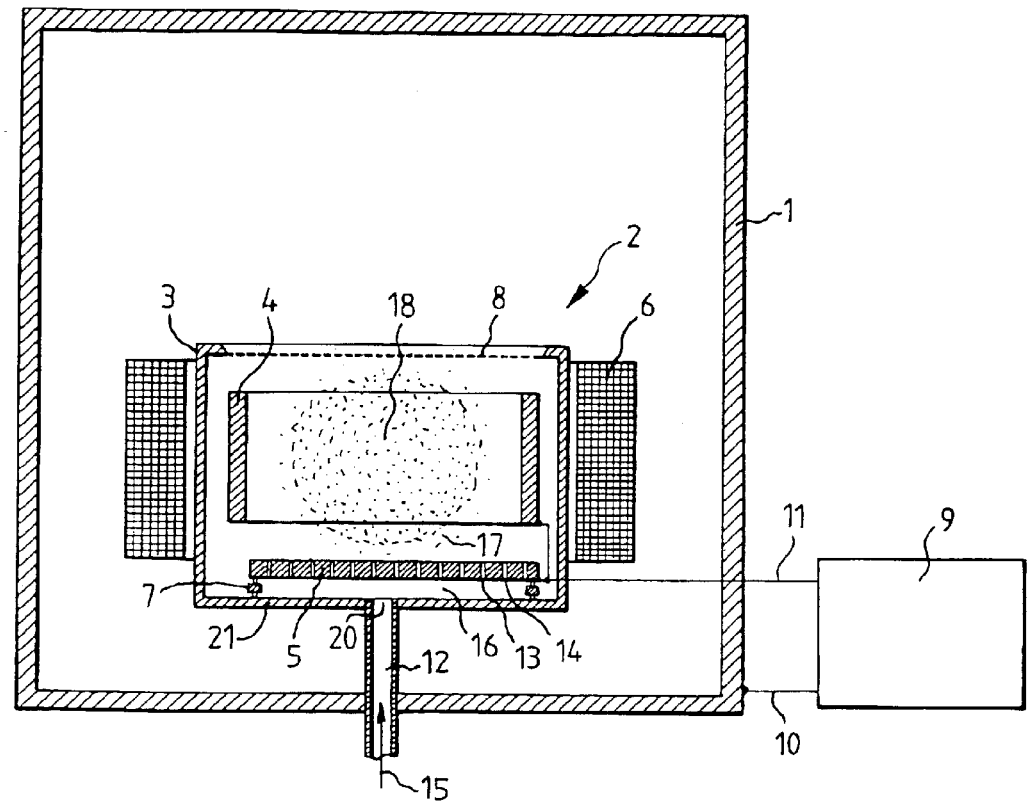
FIG. 1 a plasma source, located in a vacuum chamber.

FIG. 1 shows a vacuum housing 1, in which substrates can be coated or etched. These substrates are not shown in the schematic representation. They would be located opposite a plasma source 2, which is disposed within the vacuum housing 1. The plasma source 2 comprises, in turn, a chamber 3, which encompasses an induction loop 4 as well as a cathode plate 5. The induction loop can be comprised of a coil with one or several windings. If it consists of only one winding, it is developed as a circular curved metal sheet which encompasses the plasma. About the chamber 3 is placed a coil 6, with which a magnetic field can be generated, which, with reference to FIG. 1, extends in the vertical direction. The cathode plate 5 is disposed beneath the induction loop 4 and is connected via an electrically insulating sealing ring 7 with the bottom 21 of the chamber 3. The chamber 3 is delimited upwardly by a control grid 8, which, for example, is at the potential of the vacuum housing 1. The ion energy is adjusted through the potential of the cathode plate 5. The control grid 8 is connected to a regulatable voltage source not shown. Instead of one control grid, it is also possible to provide several control grids one behind the other. The induction loop 4, preferably developed as a metal sheet, extends with its center axis perpendicular to this control grid 8.

A high-frequency voltage source 9 is disposed outside of the vacuum housing 1 and is connected with its one pole 10 to the vacuum housing 1 and with its other pole 11 to the cathode plate 5 and to the induction loop 4. In the center of bottom 21 of chamber 3 is provided an opening 20, to which a gas inlet tube 12 is connected. The gas inlet tube 12 is also at the potential of pole 10.

Essential for the invention is that the cathode plate 5 is provided with several throughbores 13, 14 and is otherwise impermeably, but electrically insulated, connected at a spacing with the bottom 21 of chamber 3. Through the gas inlet tube 12 flows a gas 15 first into a region 16 between the bottom 21 of chamber 3 and the cathode plate 5. Only gradually does the gas reach through the throughbores 13, 14 into a region 17 above the cathode plate 5, thus into the plasma volume proper. This develops in the region 16 a higher pressure than in the region 17. Consequently, an ignition is possible in region 17 without increasing the pressure in region 17. When the plasma has ignited in region 16, the ignition also flashes over to the region 17 with the low pressure, such that within the induction coil ionized plasma 18 develops. Region 16 forms the ignition chamber, which is substantially smaller than region 17 above the cathode plate 5. The spacing between cathode plate 5 and bottom 21 corresponds to the electrode spacing of the Paschen curve. In practice, it is for example only 5 mm, since at greater spacings the volume in region 16 becomes too large. The area of region 16, which defines the ignition chamber, must be as large as possible such that a maximal portion of the cathode plate 5 is provided with a gas flow. Minimization of the ignition chamber volume therefore is not to be realized through a small area of the ignition chamber, but rather only through a small spacing. At too large a volume of the ignition chamber, the risk is given that a large portion of the energy of the high-frequency voltage source 9 is introduced into the plasma of the ignition chamber and in this way the plasma in region 17, and therewith the ion beam, are markedly attenuated.

By laying out the cathode plate 5 as a gas shower head, the gas stream entering region 17 apparently also prevents the coating of the cathode plate with insulating layers such that the plasma, once ignited, also burns more stably and no arcing takes place. As tests have shown, the plasma sources ignite at a pressure pulse of 0.05 Pa faultlessly while previously 5 Pa were required.

The pressure in the ignition chamber, i.e. in region 16, is chosen such that at the typically utilized gas flows, for example 50 sccm, the proximity of the minimum of the Paschen curve is reached. This minimum is between 10 Pa and 100 Pa. The pressure can be adjusted through the cross section and the number of holes 13, 14 in the cathode plate 5 as well as by varying the gas flow. The slight pressure increase, which is required during the ignition process, is attained through an increased gas flow.

The cathode plate 5 is implemented in FIG. 1 radially symmetrically, i.e. it is a round plate provided with approximately 52 bores. The substrate, which is to be worked, is not shown in FIG. 1. It is disposed closely beneath the upper wall of the vacuum housing 1. Next to the plasma source 2 and within the vacuum housing 1 a (not shown) vaporizer can be disposed, in which $SiO_2$ is vaporized. The $SiO_2$ subsequently also reaches the ion source indirectly through dispersion of the vaporized silicon molecules by the residual gas molecules in the installation. The ion beam generated with the plasma source serves for concentration of the layer vapor-deposited on the substrate.

Oxygen and argon are preferably utilized as gas 15. Oxygen is required for postoxidation of the layer applied on the substrate, and argon facilitates the igniting of the plasma source. In the example of FIG. 1 the ignition volume 16 is formed between bottom 21 of chamber 3 and the cathode plate 5. However, it is also possible to provide the ignition volume on a lateral wall of chamber 3. If a depression is milled into a side wall and is sealed off with the induction loop 4 and many small holes are bored into the induction loop developed as a metal sheet, a side chamber is also created, which can serve as an ignition aid. The induction loop 4 in this case would have the same potential as the cathode plate 5.

The plasma source 2 is depicted in FIG. 1 as inductively coupled. However, it is understood that an additional capacitive coupling is possible, as described in DE 100 08 485 A1, or that any desired irradiation by electromagnetic waves is realizable.

Figure 2:
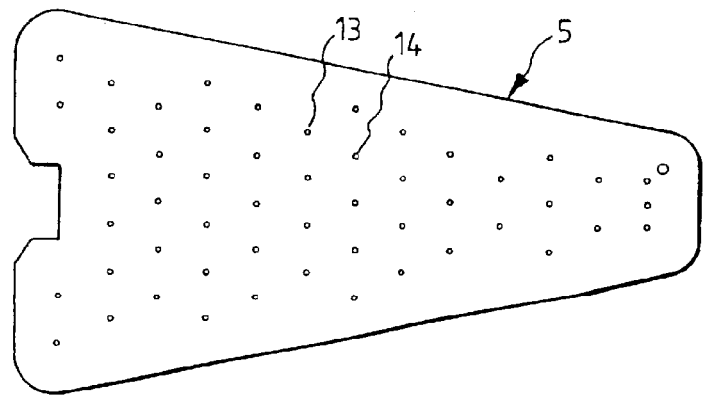
FIG. 2 a plate, which can be utilized in the plasma source.

But, as shown in FIG. 2, the cathode plate can also be pie-shaped and be provided with 52 bores.

It is claimed:

1. A plasma source comprising:
   a chamber, in which plasma is generated,
   a plate at a spacing from a wall of the chamber,
   with this plate comprising throughbores, through which gas flows into a plasma volume, whereby this plate forms with the wall of the chamber a closed volume and a gas inlet is provided in this wall; wherein the plate is connected with the wall via an electric insulation and that an electric voltage source is provided between the plate and the wall.

2. The plasma source as claimed in claim 1, wherein the voltage source is a high-frequency voltage source.

3. The plasma source as claimed in claim 2, wherein the induction loop is electrically connected with the high-frequency voltage source.

4. The plasma source as claimed in claim 2, wherein the plate and the induction loop is connected with one polarity of the high-frequency voltage source, while the chamber is connected with the other polarity of this high-frequency voltage source.

5. The plasma source as claimed in claim 1, wherein an induction loop is provided in the chamber, the induction loop being disposed above the plate.

6. The plasma source as claimed in claim 5, wherein a device is provided which produces a static magnetic field in the volume encompassed by the induction loop.

7. The plasma source as claimed in claim 6, wherein the device is a coil.

8. The plasma source as claimed in claim 5, wherein the induction loop is electrically connected with the high-frequency voltage source.

9. The plasma source as claimed in claim 5, wherein the plate and the induction loop is connected with one polarity of the high-frequency voltage source, while the chamber is connected with the other polarity of this high-frequency voltage source.

10. The plasma source as claimed in claim 5, wherein the induction loop comprises only one winding and is composed of a curved metal sheet.

11. The plasma source as claimed in claim 10, wherein the induction loop is provided with throughbores.

12. The plasma source as claimed in claim 1, wherein the electric insulation is also a sealing.

13. The plasma source as claimed in claim 1, wherein the plate comprises approximately 52 throughbores with a diameter of approximately 1 mm disposed equidistantly.

14. The plasma source as claimed in claim 1, wherein the plate and the induction loop is connected with one polarity of the high-frequency voltage source, while the chamber is connected with the other polarity of this high-frequency voltage source.

15. The plasma source as claimed in claim 1, wherein the plate is developed conically in top view.

16. The plasma source as claimed in claim 1, wherein it is disposed in the interior of a vacuum housing.

17. The plasma source as claimed in claim 1, wherein in the chamber a pressure $p<1$ Pa obtains.

18. The plasma source as claimed in claim 1, wherein the generated plasma is essentially an ion beam.

19. The plasma source as claimed in claim 1, wherein the wall of the chamber is the bottom.

20. The plasma source as claimed in claim 1, wherein the wall of the chamber is a side wall.

21. The plasma source as claimed in claim 20, wherein the induction loop is provided with throughbores.

22. The plasma source as claimed in claim 1, wherein the plate is an around disk.

23. The plasma source as claimed in claim 1, wherein the volume forms an ignition chamber between the plate and the wall, said ignition chamber being smaller than the plasma volume provided above the plate.

24. The plasma source as claimed in claim 23, wherein a pressure in the ignition chamber is greater than a pressure in the plasma volume.

25. The plasma source as claimed in claim 24, wherein the pressure in the ignition chamber is elected such that with typical gas flows the pressure is within a minimum of the Paschen curve.

26. The plasma source as claimed in claim 25, wherein the minimum is between 0.1 and 1 mbar.

27. The plasma source as claimed in claim 25, wherein a pressure can be adjusted by the cross-section and a number of the holes in a plate.

* * * * *